(12) United States Patent
Abe et al.

(10) Patent No.: US 11,345,541 B2
(45) Date of Patent: May 31, 2022

(54) ARTICLE TRANSPORT FACILITY

(71) Applicant: Daifuku Co., Ltd., Osaka (JP)

(72) Inventors: Takeshi Abe, Hinocho (JP); Tsuyoshi Yoshizaki, Hinocho (JP); Jun Tanaka, Hinocho (JP); Katsumichi Sameshima, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 104 days.

(21) Appl. No.: 17/017,968

(22) Filed: Sep. 11, 2020

(65) Prior Publication Data

US 2021/0078801 A1    Mar. 18, 2021

(30) Foreign Application Priority Data

Sep. 12, 2019    (JP) .............................. JP2019-166398

(51) Int. Cl.
*B65G 1/04*    (2006.01)
(52) U.S. Cl.
CPC .... *B65G 1/0421* (2013.01); *B65G 2203/0233* (2013.01); *B65G 2203/042* (2013.01)
(58) Field of Classification Search
CPC .......... B65G 1/0421; B65G 2203/0233; B65G 2203/042
See application file for complete search history.

(56) References Cited

U.S. PATENT DOCUMENTS

| 4,052,702 A * | 10/1977 | Smith .................... G06Q 10/08 710/60 |
| 2010/0080449 A1* | 4/2010 | Yoshioka ............. G06K 9/6253 382/155 |
| 2018/0111757 A1* | 4/2018 | Abe ................... H01L 21/67769 |
| 2019/0193935 A1* | 6/2019 | Abe ................... H01L 21/67769 |

FOREIGN PATENT DOCUMENTS

JP    201083593 A    4/2010

\* cited by examiner

*Primary Examiner* — Saul Rodriguez
*Assistant Examiner* — Willie Berry, Jr.
(74) *Attorney, Agent, or Firm* — The Webb Law Firm

(57) ABSTRACT

A control unit that controls a transport apparatus executes selection control to select one accommodation portion as a selected accommodation portion, movement control to control the transport apparatus so as to move a transport support portion to a corresponding position, determination control to determine whether or not a detection target portion is detected by a detecting portion, transfer control to control the transport apparatus so as to transfer an article from the transport support portion to an accommodation support member, and update setting control to set the selected accommodation portion and related accommodation portions as prohibited accommodation portions if it is determined, in the determination control, that the detection target portion is not detected, and after the update setting control, the control unit again executes the selection control to newly select a selected accommodation portion, and executes the movement control so as to move the transport support portion to a corresponding position corresponding to the newly selected accommodation portion.

5 Claims, 10 Drawing Sheets

US 11,345,541 B2

ARTICLE TRANSPORT FACILITY

CROSS-REFERENCE TO RELATED APPLICATION

This application claims priority to Japanese Patent Application No. 2019-166398 filed Sep. 12, 2019, the disclosure of which is hereby incorporated by reference in its entirety.

BACKGROUND OF THE INVENTION

1. Field of the Invention

The present invention relates to an article transport facility including an article accommodation rack that includes a plurality of accommodation portions arranged in a vertical direction and a left-right direction, a transport apparatus that transports articles to the accommodation portions, and a control unit that controls the transport apparatus.

2. Description of the Related Art

As such an article transport facility, an article transport facility described in JP 2010-083593A (Patent Document 1) is known, for example. In the following, the reference numerals or terms in parentheses in "Description of the Related Art" are those described in the related art document. The control unit of the article transport facility described in Patent Document 1 selects one of the plurality of accommodation portions as a selected accommodation portion, and controls the transport apparatus (an article transfer device 12 and a transporting operation means 4) so as to move a transport support portion (an article support 18) to a corresponding position that corresponds to the selected accommodation portion. Also, the control unit determines whether or not a detection target portion (a reflecting plate 26) is detected by a detecting portion (a photoelectronic sensor 25) in such a state in which the transport support portion is located at the corresponding position. Upon determining that the detection target portion is detected by the detecting portion, the control unit controls the transport apparatus so as to transfer an article from the transport support portion to an accommodation support member (an article supporting platform 6), and upon determining that the detection target portion is not detected by the detecting portion, the control unit causes the transport apparatus to make an emergency stop without transferring the article.

In an article transport facility such as that described above, there are cases in which the detection target portion is not detected by the detecting portion even in a state in which the transport support portion is located at the corresponding position corresponding to the selected accommodation portion, as a result of the position of the detection target portion provided on the accommodation support member shifting due to deformation of the accommodation support member of the selected accommodation portion, for example. In such a case, when an article is accommodated onto the accommodation support member, problems may occur such as a case in which the article comes into contact with the accommodation support member and is damaged and a case in which the article can not be appropriately supported by the accommodation support member and falls off. Therefore, the above-described article transport facility avoids these problems by causing the transport apparatus to make an emergency stop upon determining that the detection target portion is not detected by the detecting portion in a state in which the transport support portion is located at the corresponding position.

SUMMARY OF THE INVENTION

However, in the above-described article transport facility, the transport apparatus is caused to make an emergency stop if the detection target portion is not detected by the detecting portion in a state in which the transport support portion is located at the corresponding position corresponding to the selected accommodation portion. Accordingly, the transport of articles performed by the transport apparatus is interrupted and the transport efficiency of articles in the article transport facility is reduced.

Therefore, there is demand for an article transport facility that can continuously transport articles while avoiding the occurrence of problems when accommodating articles.

An article transport facility according to the present disclosure includes an article accommodation rack that includes a plurality of accommodation portions arranged in a vertical direction and a left-right direction, a transport apparatus that transports articles to the accommodation portions, and a control unit that controls the transport apparatus, wherein each of the plurality of accommodation portions includes an accommodation support member that supports an article accommodated in the accommodation portion, the transport apparatus includes a transport support portion that supports an article, a transfer portion that transfers an article from the transport support portion to the accommodation portion in a state in which the transport support portion is located at a corresponding position that corresponds to the accommodation portion, and a detecting portion that detects a detection target portion included in the accommodation support member in a state in which the transport support portion is located at the corresponding position, the control unit executes setting control to set, with respect to each of the plurality of accommodation portions, whether the accommodation portion is an allowed accommodation portion or a prohibited accommodation portion, accommodating an article in the allowed accommodation portion being allowed, accommodating an article in the prohibited accommodation portion being prohibited, selection control to select, as a selected accommodation portion, one accommodation portion that is set as the allowed accommodation portion from among the plurality of accommodation portions, movement control to control the transport apparatus so as to move the transport support portion to the corresponding position corresponding to the selected accommodation portion, determination control to determine whether or not the detection target portion is detected by the detecting portion after the movement control, transfer control to control the transport apparatus so as to transfer an article from the transport support portion to the accommodation support member included in the selected accommodation portion if it is determined, in the determination control, that the detection target portion is detected, and update setting control to set the selected accommodation portion and one or more related accommodation portions each as the prohibited accommodation portion if it is determined, in the determination control, that the detection target portion is not detected, the related accommodation portions being accommodation portions each having a positional relationship set in advance with respect to the selected accommodation portion, and after the update setting control, the control unit again executes the selection control to newly select, as the selected accommodation portion, one accommodation portion that is set as the allowed accommodation portion from among the plurality of accommodation portions, and executes the movement control to move the transport support portion to the corresponding position corresponding to the selected accommodation portion that has been newly selected.

According to this configuration, the control unit selects an accommodation portion as the selected accommodation portion by the selection control, and moves the transport support portion to the corresponding position corresponding to the selected accommodation portion by the movement control. In such a state in which the transport support portion has been moved to the corresponding position corresponding to the selected accommodation portion, if it is determined that the detection target portion is not detected by the detecting portion, the control unit executes the update setting control to set the selected accommodation portion and the related accommodation portions as the prohibited accommodation portions.

As a cause of the detection target portion not being detected by the detecting portion in a state in which the transport support portion is located at the corresponding position corresponding to the selected accommodation portion, it is possible to consider deformation of the accommodation support member of the selected accommodation portion and consequent shifting of the position of the detection target portion provided in the accommodation support member. If the accommodation support member is deformed, when an article is accommodated in the accommodation portion including the accommodation support member, problems may occur such as a case in which the article comes into contact with the accommodation support member and is damaged and a case in which the article falls off from the accommodation support member. Also, when an article is accommodated in another accommodation portion that is located around the accommodation portion including the deformed accommodation support member, problems may occur such as a case in which the article comes into contact with the deformed accommodation support member and is damaged and a case in which the article falls off. However, according to this configuration, in such cases, the selected accommodation portion and the related accommodation portions are set as the prohibited accommodation portions in the update setting control and will not be selected as the selected accommodation portion in the following selection control, and therefore it is possible to avoid problems that would occur when articles are accommodated in these accommodation portions. Furthermore, after the update setting control is executed as described above, the selection control and the movement control are executed with respect to updated allowed accommodation portions, and therefore articles can be continuously transported. Thus, it is possible to continuously transport articles while avoiding the occurrence of problems when accommodating the articles.

DETAILED DESCRIPTION OF PREFERRED EMBODIMENTS

1. Embodiment

The following describes an embodiment of an article transport facility according to the present invention based on the drawings.

Figure 1:
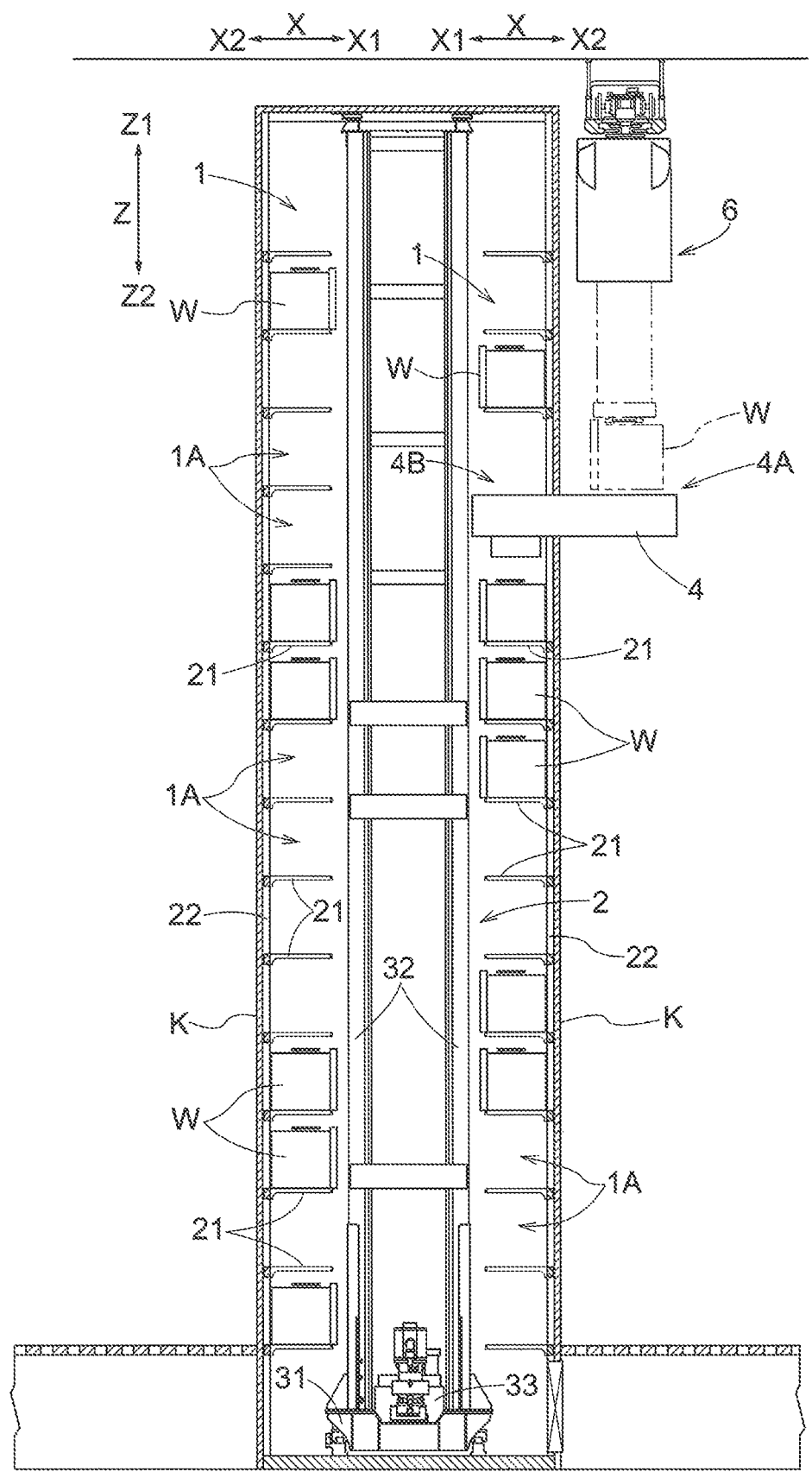
FIG. 1 is a side view of an article transport facility.
Figure 2:
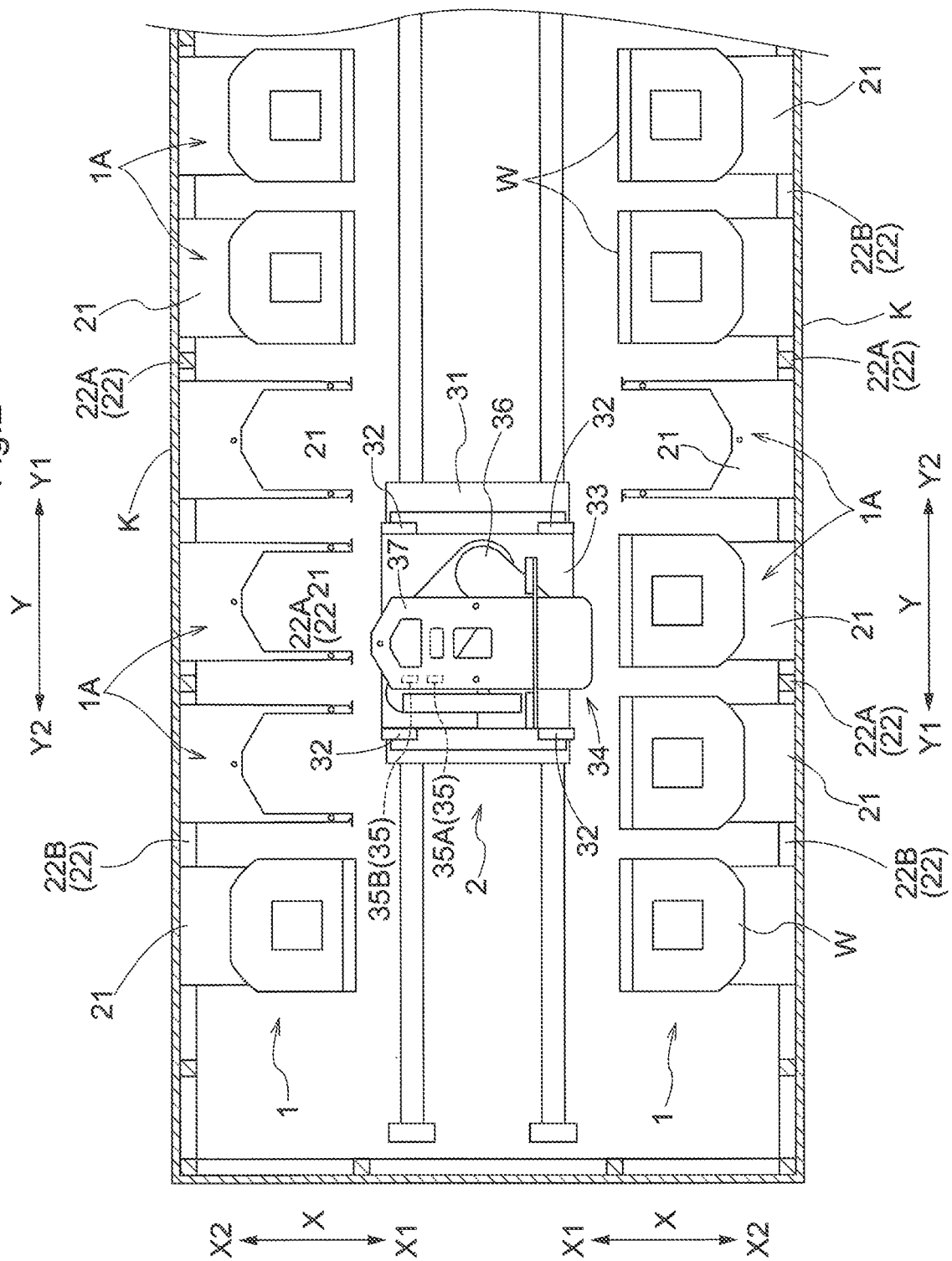
FIG. 2 is a plan view showing a portion of the article transport facility.

As shown in FIGS. 1 and 2, the article transport facility includes an article accommodation rack 1 that includes a plurality of accommodation portions 1A that accommodate articles W and a stacker crane 2 that transports articles W. Also, as shown in FIG. 1, the article transport facility includes a wall member K that surrounds a region in which the article accommodation rack 1 and the stacker crane 2 are installed and a transport conveyor 4 that is installed so as to pass through the wall member K and transports articles W. Note that in the present embodiment, the articles W are FOUPs (Front Opening Unified Pods) in which semiconductor substrates (wafers) are accommodated.

The transport conveyor 4 is configured to transport an article W between an outside position 4A that is located on the outside of the wall member K and an inside position 4B that is located on the inside of the wall member K. In the article transport facility, when an article W is placed on the outside position 4A of the transport conveyor 4 by an overhead transport vehicle 6, the article W is transported by the transport conveyor 4 from the outside position 4A to the inside position 4B, and thereafter transported by the stacker crane 2 from the inside position 4B of the transport conveyor 4 to an accommodation portion 1A of the article accommodation rack 1. Also, in the article transport facility, when an article W is transported by the stacker crane 2 from an accommodation portion 1A of the article accommodation rack 1 to the inside position 4B of the transport conveyor 4, the article W is transported by the transport conveyor 4 from the inside position 4B to the outside position 4A, and thereafter transported by the overhead transport vehicle 6 from the outside position 4A. Note that the stacker crane 2 corresponds to a transport apparatus that transports articles W to accommodation portions 1A.

The following describes each configuration of the article transport facility. As shown in FIG. 2, a direction along which the article accommodation rack 1 extends when viewed from a vertical direction Z is defined as a left-right direction Y, and a direction orthogonal to the left-right direction Y when viewed from the vertical direction Z is defined as a front-back direction X. In the front-back direction X, the stacker crane 2 side as viewed from the article accommodation rack 1 will be referred to a front side X1, and the opposite side will be referred to a back side X2. Also, one side in the left-right direction Y will be referred to as a right side Y1, and the opposite side will be referred to as a left side Y2. Note that the right side Y1 and the left side Y2 are defined in a state of viewing the article accommodation rack 1 from the stacker crane 2. Also, in descriptions regarding articles W, the front-back direction X and the left-right direction Y are defined based on a state in which the articles W are accommodated in the accommodation portions 1A.

Articles

Figure 4:
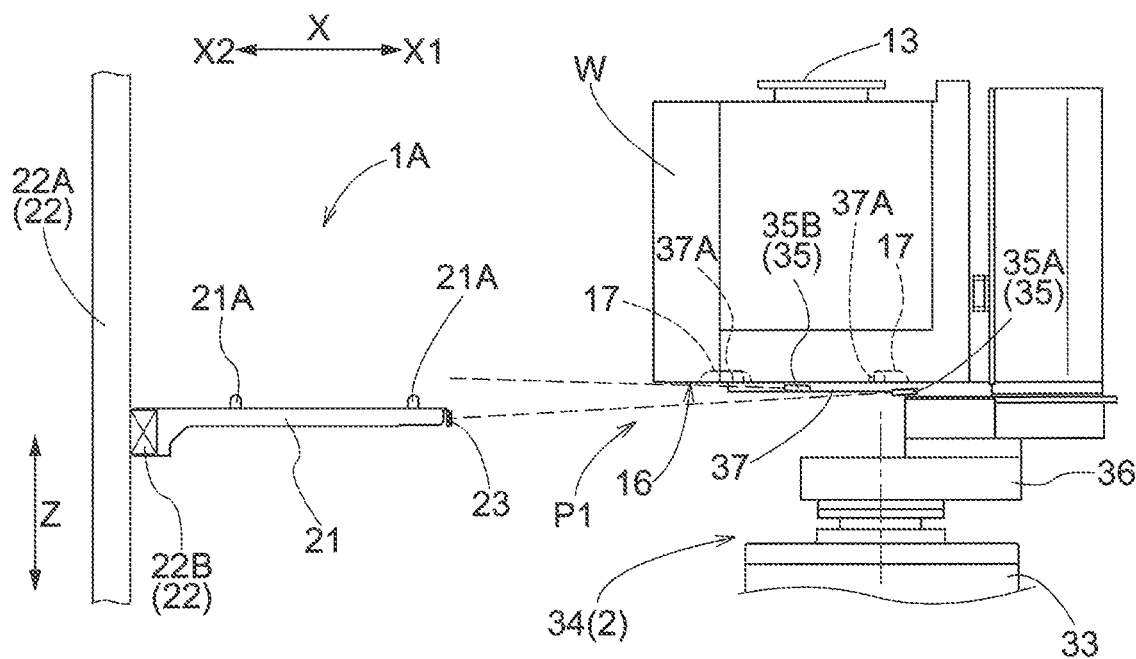
FIG. 4 is a side view of the transfer apparatus showing a state in which a transport support portion is located at a first corresponding position.
Figure 5:
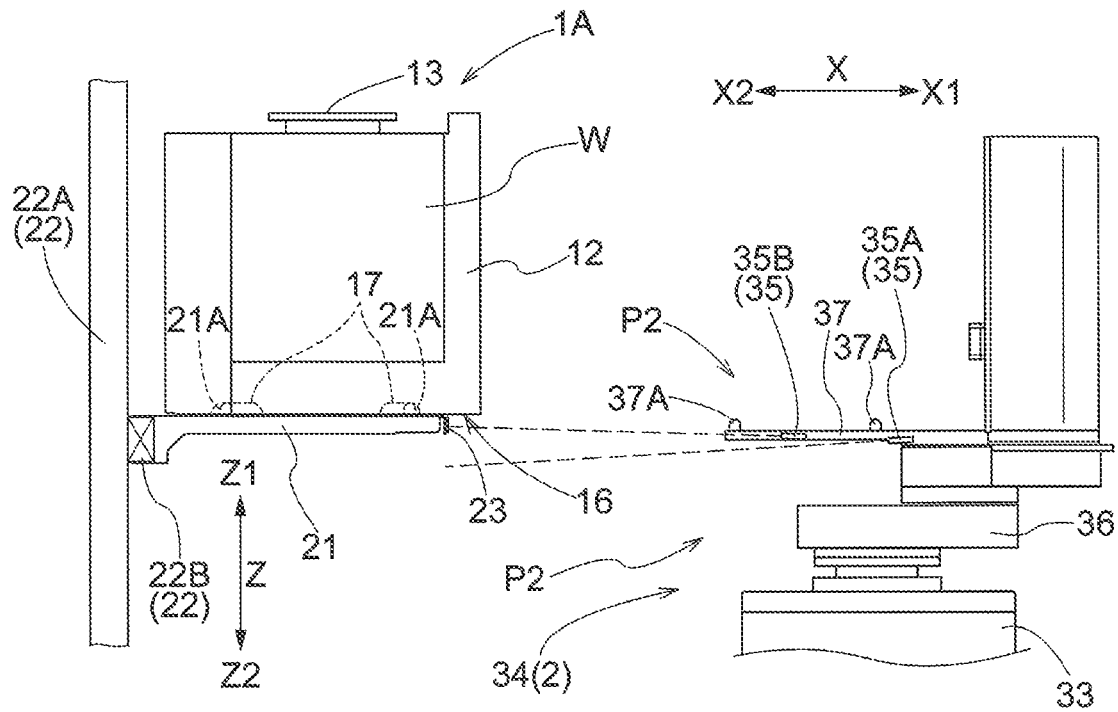
FIG. 5 is a side view of the transfer apparatus showing a state in which the transport support portion is located at a second corresponding position.

As shown in FIGS. 4 and 5, each article W includes a main body portion 12 that accommodates a semiconductor substrate, a flange portion 13 that is provided at an upper end portion of the article W, and a detachable lid member (not shown) that closes an opening (not shown) formed in a front surface of the main body portion 12. Three groove-shaped engaged portions 17 that are recessed upward are formed in a bottom surface 16 of the article W.

Article Accommodation Rack

As shown in FIGS. 1 and 2, the article accommodation rack 1 includes a plurality of accommodation portions 1A that are arranged in the vertical direction Z and the left-right direction Y. Each of the accommodation portions 1A includes an accommodation support member 21 that supports an article W accommodated in the accommodation portion. The accommodation support member 21 is configured to support the bottom surface 16 of the article W from below. More specifically, as shown in FIGS. 4 and 5, the accommodation support member 21 includes three accommodation protrusions 21A that engage with the engaged portions 17 of the article W from below. The accommodation support member 21 is configured to support the bottom surface 16 of the article W from below in a state in which the three accommodation protrusions 21A engage with the engaged portions 17 of the article W from below.

As shown in FIGS. 1 and 2, the article accommodation rack 1 includes frameworks 22. The frameworks 22 are provided at back side X2 end portions of the article accommodation rack 1. As shown in FIGS. 2, 4, and 5, each framework 22 is formed like a lattice by combining a plurality of vertical frame members 22A that are arranged so as to extend along the vertical direction Z and horizontal frame members 22B that are arranged so as to extend along the left-right direction Y. The accommodation support member 21 is constituted by plate-shaped members that extend along the front-back direction X and the left-right direction Y. A back side X2 end portion of the accommodation support member 21 is coupled to a horizontal frame member 22B. That is, the accommodation support member 21 is supported by the framework 22 in a cantilever manner so as to protrude from the framework 22 toward the front side X1.

Figure 3:
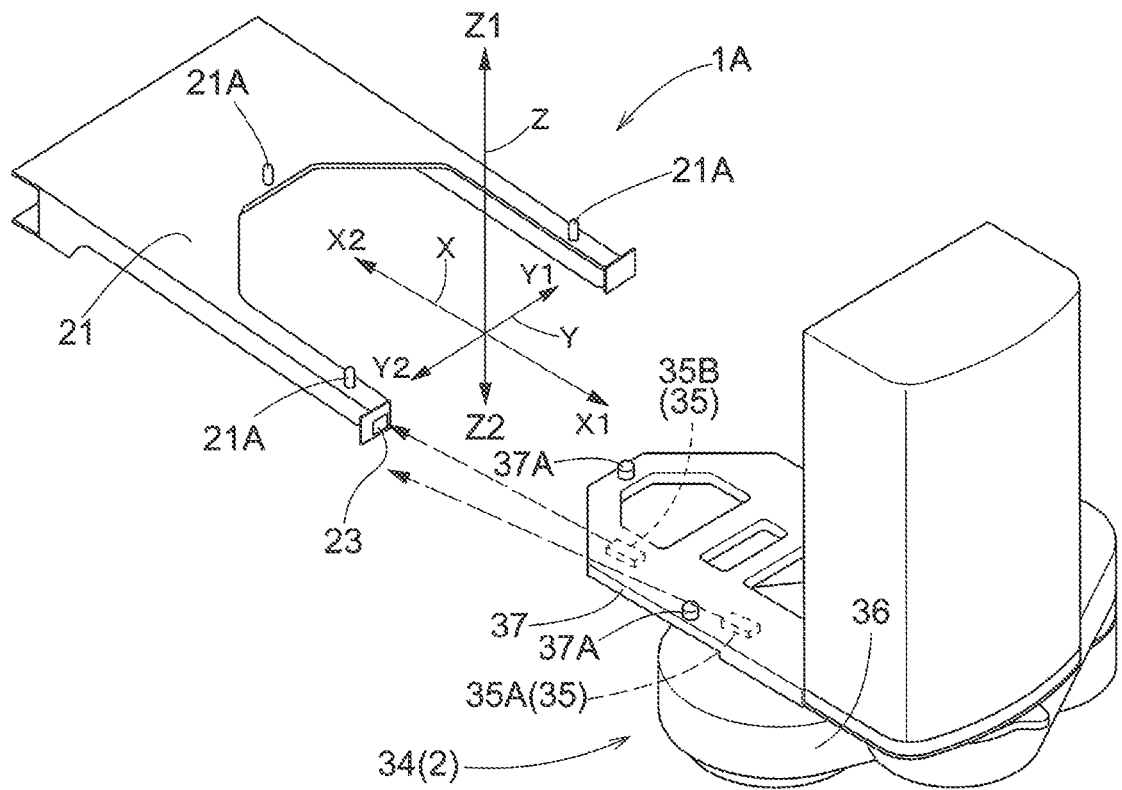
FIG. 3 is a perspective view of a transfer apparatus.

As shown in FIG. 3, the accommodation support member 21 includes a detection target portion 23. In the present embodiment, the detection target portion 23 is a retroreflective plate (reflects incident light toward the light source). The detection target portion 23 is provided at a front side X1 end portion of the accommodation support member 21. As shown in FIG. 4, if a transfer apparatus 34 is located at a first corresponding position P1 that corresponds to an accommodation portion 1A and the accommodation support member 21 is in an appropriate state, light emitted from a first detector 35A that is provided in the stacker crane 2 enters the detection target portion 23. Also, as shown in FIG. 5, if the transfer apparatus 34 is located at a second corresponding position P2 that corresponds to an accommodation portion 1A and the accommodation support member 21 is in the appropriate state, light emitted from a second detector 35B that is provided in the stacker crane 2 enters the detection target portion 23. Note that the appropriate state of the accommodation support member 21 is a state in which the accommodation support member 21 is fixed to a position of the framework 22 that is set in advance and the accommodation support member 21 is not deformed from a prescribed shape. Note that similarly to the accommodation support member 21, the transport conveyor 4 is also provided with the detection target portion 23, although this is not shown.

Stacker Crane

As shown in FIGS. 1 and 2, the stacker crane 2 includes a travelling carriage 31 that travels along the left-right direction Y, masts 32 that stand upright from the travelling carriage 31, a lifting/lowering member 33 that moves up and down along the masts 32, the transfer apparatus 34 that is supported by the lifting/lowering member 33, and a detecting portion 35 that detects the detection target portion 23.

As shown in FIGS. 3 to 5, the transfer apparatus 34 includes a link mechanism 36 that is coupled to the lifting/lowering member 33 in a bendable and stretchable manner and a transport support portion 37 that is coupled to a leading end portion of the link mechanism 36 in an interlocked manner such that the transport support portion 37 turns around an axis extending along the vertical direction Z together with bending or stretching of the link mechanism 36. The transfer apparatus 34 is configured to move the transport support portion 37 back and forth along the front-back direction X in a state in which the posture of the transport support portion 37 is maintained, by bending or stretching the link mechanism 36 using an extension/retraction motor 38 (see FIG. 6). The transfer apparatus 34 is configured to transfer an article W between a transfer target position (an accommodation portion 1A or the inside position 4B of the transport conveyor 4) and the transfer apparatus 34 through backward and forward movement of the transport support portion 37 and upward and downward movement of the lifting/lowering member 33. Note that the transfer apparatus 34 corresponds to a transfer portion that transfers an article W from the transport support portion 37 to an accommodation portion 1A in a state in which the transport support portion 37 is located at a corresponding position corresponding to the accommodation portion 1A.

As shown in FIG. 4, the transport support portion 37 is configured to support the bottom surface 16 of the article W from below. More specifically, the transport support portion 37 includes three transport protrusions 37A that engage with the engaged portions 17 of the article W from below, and the transport support portion 37 is configured to support the bottom surface 16 of the article W from below in a state in which the three transport protrusions 37A engage with the engaged portions 17 of the article W from below.

As shown in FIGS. 3 to 5, the detecting portion 35 is supported by the transfer apparatus 34. In the present embodiment, the detecting portion 35 is supported by the transport support portion 37 of the transfer apparatus 34. The detecting portion 35 includes the first detector 35A that emits light toward the detection target portion 23 and receives reflection light from the detection target portion 23 in a state in which the transport support portion 37 is located at the first corresponding position P1 as shown in FIG. 4 and the second detector 35B that emits light toward the detection target portion 23 and receives reflection light from the detection target portion 23 in a state in which the transport support portion 37 is located at the second corresponding position P2 as shown in FIG. 5.

As described above, the detecting portion 35 detects the detection target portion 23 in a state in which the transport support portion 37 is located at a corresponding position (the first corresponding position P1 or the second corresponding position P2).

As shown in FIGS. 4 and 5, the first corresponding position P1 is set to a position that is toward an upper side Z1 with respect to the second corresponding position P2 by a set value that is set in advance. When accommodating an article W in an accommodation portion 1A, the transfer apparatus 34 is operated such that the transport support portion 37 supporting the article W protrudes toward the back side X2 from a state in which the transport support portion 37 is located at the first corresponding position P1, the article W supported by the transport support portion 37 is supported by the accommodation support member 21 while the lifting/lowering member 33 is moved toward a lower side Z2 by the set value, and then the transfer apparatus 34 is operated such that the transport support portion 37 retracts toward the front side X1 to be located at the second corresponding position P2. Thus, the article W is transferred from the transport support portion 37 to the accommodation support member 21 and accommodated in the accommodation portion 1A. When taking out the article W from the accommodation portion 1A, operations that are reverse of those performed when the article W is accommodated in the accommodation portion 1A are performed from a state in which the transport support portion 37 not supporting the article W is located at the second corresponding position P2, to transfer the article W from the accommodation support member 21 to the transport support portion 37 and take out the article W from the accommodation portion 1A.

Figure 6:
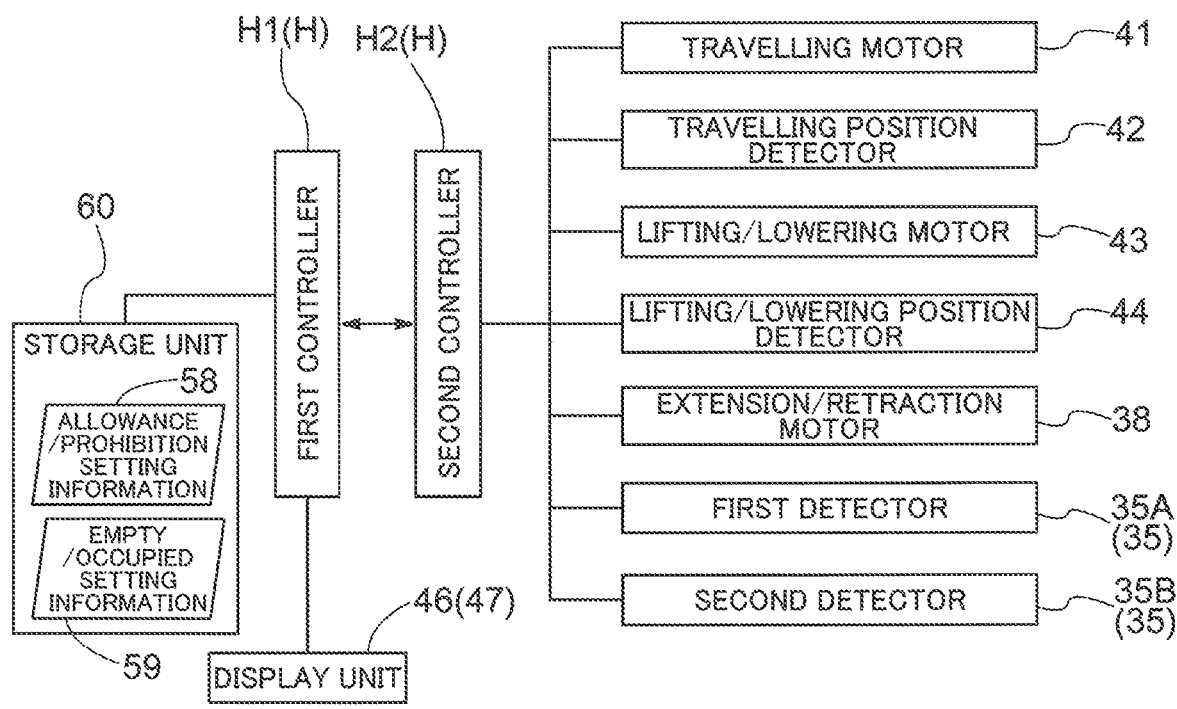
FIG. 6 is a control block diagram.

As shown in FIG. 6, the stacker crane 2 includes a travelling motor 41 for causing the travelling carriage 31 to travel, a travelling position detector 42 for detecting a travelling position of the travelling carriage 31, a lifting/lowering motor 43 for moving the lifting/lowering member 33 up and down, and a lifting/lowering position detector 44 for detecting a lifting/lowering position of the lifting/lowering member 33. In the present embodiment, the stacker crane 2 includes, as the travelling position detector 42, a laser distance meter that measures a distance from a reference position in the left-right direction Y to the travelling carriage 31, and includes, as the lifting/lowering position detector 44, a laser distance meter that measures a distance from a reference position in the vertical direction Z to the lifting/lowering member 33.

Control Unit

The article transport facility includes a control unit H that controls the stacker crane 2 and a display unit 46. The control unit H controls the stacker crane 2 so as to transport an article W between the inside position 4B of the transport conveyor 4 and an accommodation portion 1A of the article accommodation rack 1. Also, the control unit H manages, with respect to each of the plurality of accommodation portions 1A, whether the accommodation portion 1A is an allowed accommodation portion 51 or a prohibited accommodation portion 52. Accommodating an article W in the allowed accommodation portion 51 is allowed, and accommodating an article W in the prohibited accommodation portion 52 is prohibited. Furthermore, the control unit H manages, with respect to each of one or more allowed accommodation portions 51, whether the allowed accommodation portion 51 is an empty accommodation portion 53 in which an article W is not accommodated or an occupied accommodation portion 54 in which an article W is accommodated. The control unit H stores, in a storage unit 60, allowance/prohibition setting information 58 that indicates, with respect to each of the plurality of accommodation portions 1A, whether the accommodation portion 1A is an allowed accommodation portion 51 or a prohibited accommodation portion 52 and empty/occupied setting information 59 that indicates, with respect to each of the one or more allowed accommodation portions 51, whether the allowed accommodation portion 51 is an empty accommodation portion 53 or an occupied accommodation portion 54.

Also, an input unit 47 for changing the states of the accommodation portions 1A managed by the control unit H. In the present embodiment, the display unit 46 includes a touch panel, and an operator can input a change in the managed states of the accommodation portions 1A by touching the touch panel to operate the display unit 46. That is, the display unit 46 includes the function of the input unit 47. As a result of a change in the managed states of the accommodation portions 1A being input to the display unit 46 by the operator, a setting change instruction for changing the managed states of the accommodation portions 1A is transmitted to the control unit H.

Figure 11:
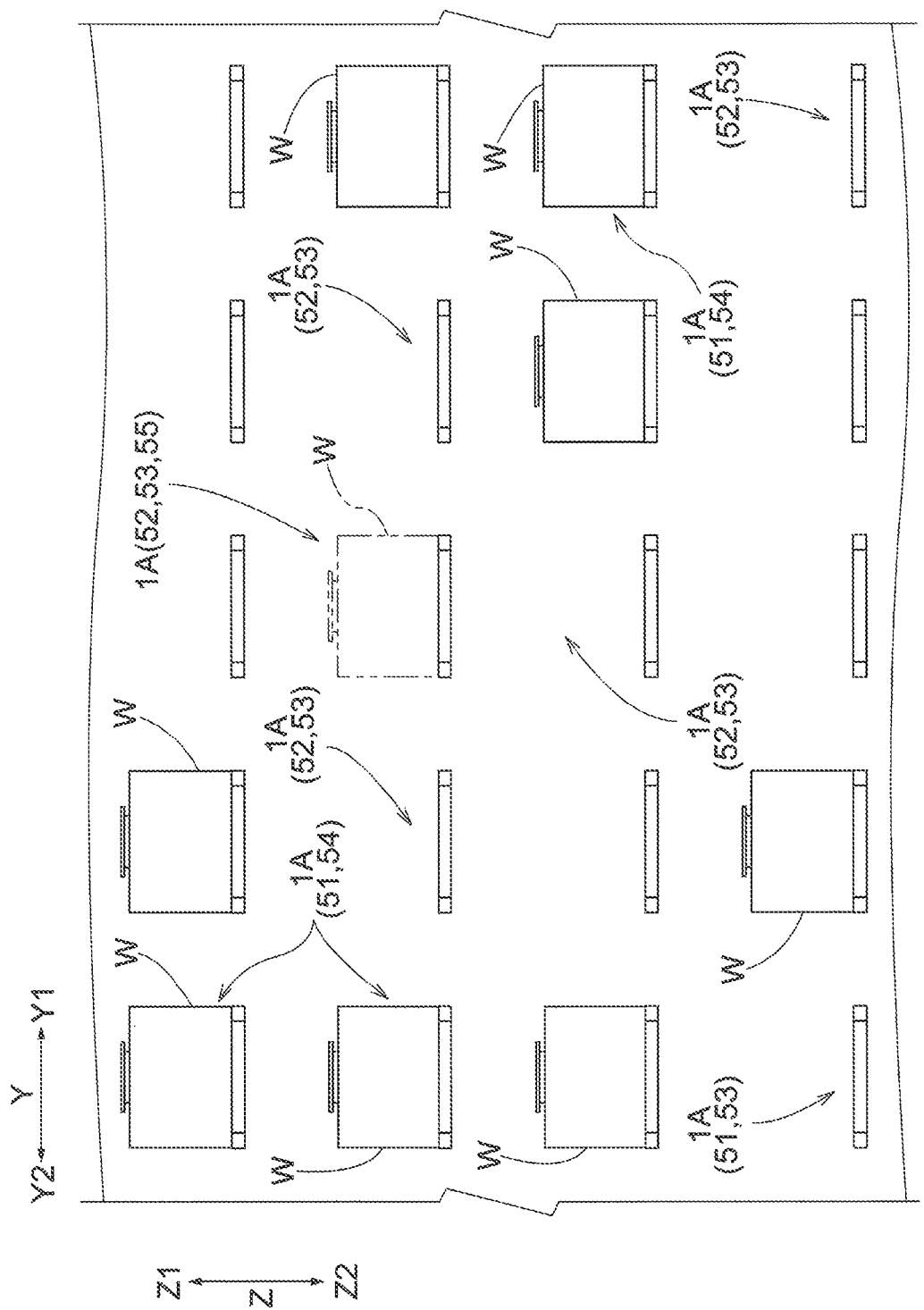
FIG. 11 is a front view showing a portion of an article accommodation rack.
Figure 12:
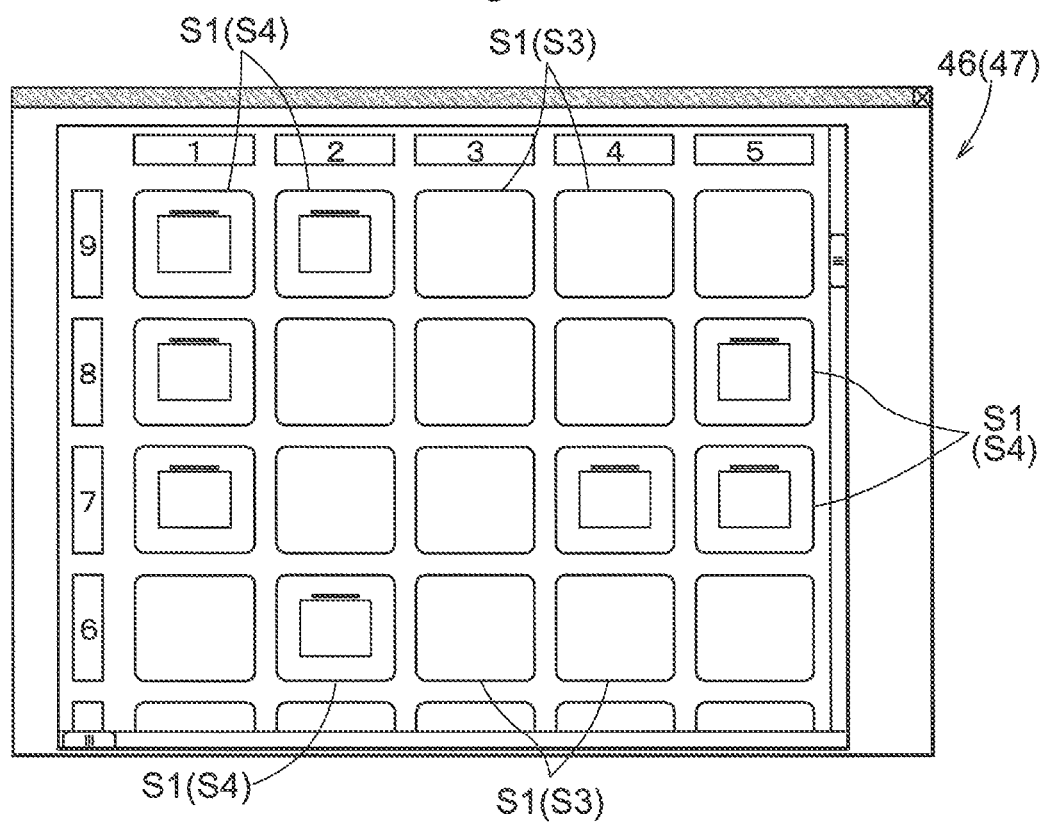
FIG. 12 is a diagram showing a display state of a display unit.
Figure 13:
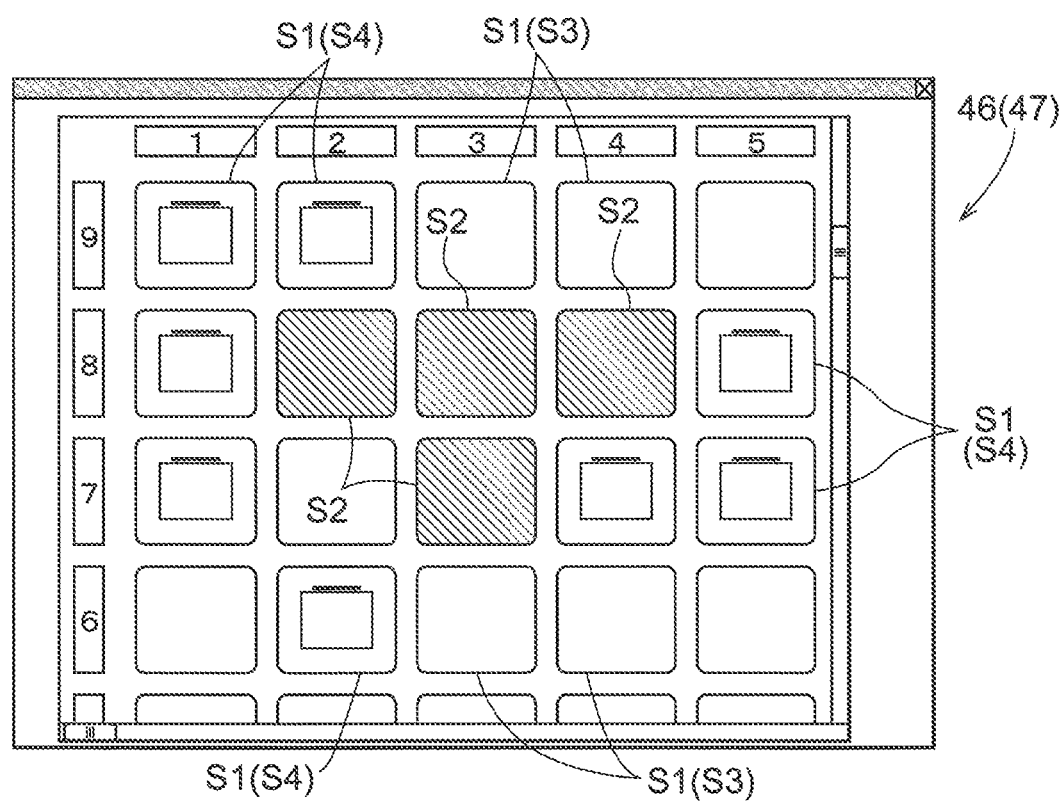
FIG. 13 is a diagram showing a display state of the display unit.

The control unit H controls the display unit 46 to display the state of each of the accommodation portions 1A. Specifically, the control unit H controls the display unit 46 to show, with respect to each of the accommodation portions 1A, whether the accommodation portion 1A is an allowed accommodation portion 51 or a prohibited accommodation portion 52 and whether the accommodation portion 1A is an empty accommodation portion 53 or an occupied accommodation portion 54. FIGS. 12 and 13 each show one example of a display state of the display unit 46. In the present embodiment, the display unit 46 displays the states of some accommodation portions 1A that are designated from among the plurality of accommodation portions 1A. Note that FIG. 12 shows the display unit 46 displaying a state in which all of the accommodation portions 1A shown in FIG. 11 are set as allowed accommodation portions 51. Also, FIG. 13 shows the display unit 46 displaying a state in which some of the accommodation portions 1A shown in FIG. 11 are set as prohibited accommodation portions 52.

As shown in FIGS. 12 and 13, an empty symbol S3 that represents an empty accommodation portion 53 and an occupied symbol S4 that represents an occupied accommodation portion 54 are displayed differently from each other in the display unit 46. In the present embodiment, the empty symbol S3 is shown by a rectangular symbol and the occupied symbol S4 is shown by a rectangular symbol inside of which a figure representing the article W (in this example, FOUP) is added. Also, as shown in FIG. 13, an allowance symbol 51 that represents an allowed accommodation portion 51 and a prohibition symbol S2 that represents a prohibited accommodation portion 52 are displayed differently from each other in the display unit 46. In the present embodiment, the prohibition symbol S2 is shown by a hatched rectangular symbol and the allowance symbol 51 is shown by a rectangular symbol that is not hatched. Therefore, by seeing the display unit 46, the operator can recognize, with respect to each of the accommodation portions 1A, whether the accommodation portion 1A is an allowed accommodation portion 51 or a prohibited accommodation portion 52, and recognize, with respect to each of one or more allowed accommodation portions 51, whether the allowed accommodation portion 51 is an empty accommodation portion 53 or an occupied accommodation portion 54.

The control unit H executes setting control, first selection control, first movement control, first determination control, first transfer control, first update setting control, second selection control, second movement control, second determination control, second transfer control, second update setting control, and scanning control.

In the setting control, the control unit H sets, with respect to each of the plurality of accommodation portions 1A, whether the accommodation portion 1A is an allowed accommodation portion 51 for which accommodation of an article W is allowed or a prohibited accommodation portion 52 for which accommodation of an article W is prohibited. Also, in the setting control of the present embodiment, the control unit H sets, with respect to each allowed accommodation portion 51, whether the allowed accommodation portion 51 is an empty accommodation portion 53 in which an article W is not accommodated or an occupied accommodation portion 54 in which an article W is accommodated. In the setting control, if a setting change instruction issued through an operation performed by the operator is received from the display unit 46, the control unit H changes, based on the setting change instruction, managed states of the accommodation portions 1A that indicate, with respect to each of the accommodation portions 1A, whether the accommodation portion 1A is an allowed accommodation portion 51 for which accommodation of an article W is allowed or a prohibited accommodation portion 52 for which accommodation of an article W is prohibited.

In the first selection control, if a plurality of transport conveyors 4 are provided, the inside position 4B of any one of the transport conveyors 4 is selected as the transport source, and one accommodation portion 1A that is set as an allowed accommodation portion 51 and as an empty accommodation portion 53 is selected as the transport destination from among the plurality of accommodation portions 1A. In the second selection control, one accommodation portion 1A that is set as an allowed accommodation portion 51 and as an occupied accommodation portion 54 is selected as the transport source from among the plurality of accommodation portions 1A, and if a plurality of transport conveyors 4 are provided, the inside position 4B of any one of the transport conveyors 4 is selected as the transport destination. Accommodation portions 1A that are selected in the first selection control and the second selection control will be referred to as selected accommodation portions 55. Note that the first selection control, first reselection control, and second reselection control, which will be described later, correspond to selection control in which one accommodation portion 1A that is set as an allowed accommodation portion 51 is selected as a selected accommodation portion 55 from among the plurality of accommodation portions 1A.

In the first movement control, the stacker crane 2 is operated such that the transport support portion 37 is located at the first corresponding position P1 corresponding to the transport destination. In the first determination control, it is determined whether or not the detection target portion 23 is detected by the first detector 35A after the first movement control. In the first transfer control, the stacker crane 2 is operated so as to transfer an article W from the transport support portion 37 to the transport destination. In the second movement control, the stacker crane 2 is operated such that the transport support portion 37 is located at the second corresponding position P2 corresponding to the transport source. In the second determination control, it is determined whether or not the detection target portion 23 is detected by the second detector 35B after the second movement control. In the second transfer control, the stacker crane 2 is operated so as to transfer an article W from the transport source to the transport support portion 37. Note that the first movement control in a case in which the transport destination is the selected accommodation portion 55 corresponds to movement control in which the transport apparatus is controlled so as to move the transport support portion 37 to a corresponding position corresponding to the selected accommodation portion 55. In the present embodiment, determination control in which it is determined whether or not the detection target portion 23 is detected by the detecting portion 35 after the movement control includes the first determination control in a case in which the transport destination is the selected accommodation portion 55 and the scanning control, which will be described later. Also, the first transfer control in a case in which the transport destination is the selected accommodation portion 55 corresponds to transfer control in which, if it is determined, in the determination control, that the detection target portion 23 is detected, the transport apparatus is controlled so as to transfer an article W from the transport support portion 37 to the accommodation support member 21 included in the selected accommodation portion 55.

In the first update setting control, the selected accommodation portion 55 and related accommodation portions 56, which are accommodation portions 1A each having a positional relationship set in advance with respect to the selected accommodation portion 55, are set as prohibited accommodation portions 52, in a case in which it is determined, in the determination control (the first determination control and the scanning control), that the detection target portion 23 is not detected. In the present embodiment, the related accommodation portions 56 are accommodation portions 1A that are adjacent to the selected accommodation portion 55 on the lower side Z2, the right side Y1, and the left side Y2 of the selected accommodation portion 55 for which it is determined, in the determination control, that the detection target portion 23 is not detected. Note that the first update setting control corresponds to update setting control. In the second update setting control, the selected accommodation portion 55 is set as an occupied accommodation portion 54 after the first transfer control is executed, and the selected accommodation portion 55 is set as an empty accommodation portion 53 after the second transfer control is executed.

Figure 14:
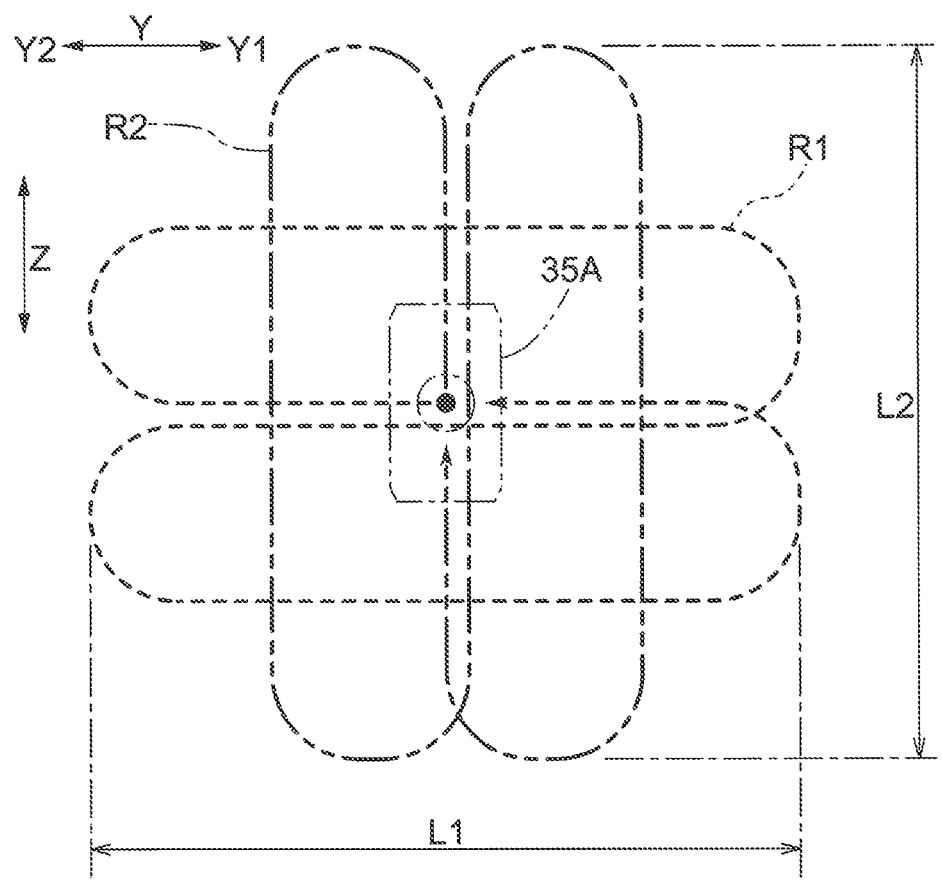
FIG. 14 is a diagram showing movement of a first detector in scanning control.

In the scanning control, the position of the detecting portion 35 is moved in a prescribed range. As shown in FIG. 14, in the scanning control of the present embodiment, the stacker crane 2 is reciprocated in the left-right direction Y to reciprocate the first detector 35A and the second detector 35B together along the left-right direction Y by a first prescribed width L1, and the lifting/lowering member 33 is reciprocated in the vertical direction Z to reciprocate the first detector 35A and the second detector 35B together by a second prescribed width L2. In the present embodiment, the prescribed range is defined by the first prescribed width L1 in the left-right direction Y and the second prescribed width L2 in the vertical direction Z. The first prescribed width L1 is set to be narrower than a distance between accommodation support members 21 that are adjacent to each other in the left-right direction Y, and the second prescribed width L2 is set to be narrower than a distance between an article W accommodated in an accommodation portion 1A and the accommodation support member 21 of an upper side Z1 accommodation portion 1A that is adjacent to the accommodation portion 1A accommodating the article W.

As shown in FIG. 6, the control unit H of the present embodiment includes a second controller 112 that is installed in the stacker crane 2 and a first controller H1 that is installed on the floor and controls the display unit 46. The first controller H1 and the second controller H2 are configured to exchange information with each other. The first controller H1 is a controller that manages the accommodation portions 1A and the stacker crane 2 and executes management control. The second controller H2 is a controller that controls the stacker crane 2 based on information obtained from the first controller H1, executes transport control to transport an article W from a transport source to a transport destination, and executes, in the transport control, second transport control to transfer the article W from the transport source to the transport support portion 37 (pick up the article W from the transport source) and first transport control to transfer the article W from the transport support portion 37 to the transport destination (put down the article W onto the transport destination).

Next, the management control, the transport control, the first transport control, and the second transport control will be described based on the flowchart of the management control shown in FIG. 7, the flowchart of the transport control shown in FIG. 8, the flowchart of the second transport control shown in FIG. 9, and the flowchart of the first transport control shown in FIG. 10.

Figure 7:
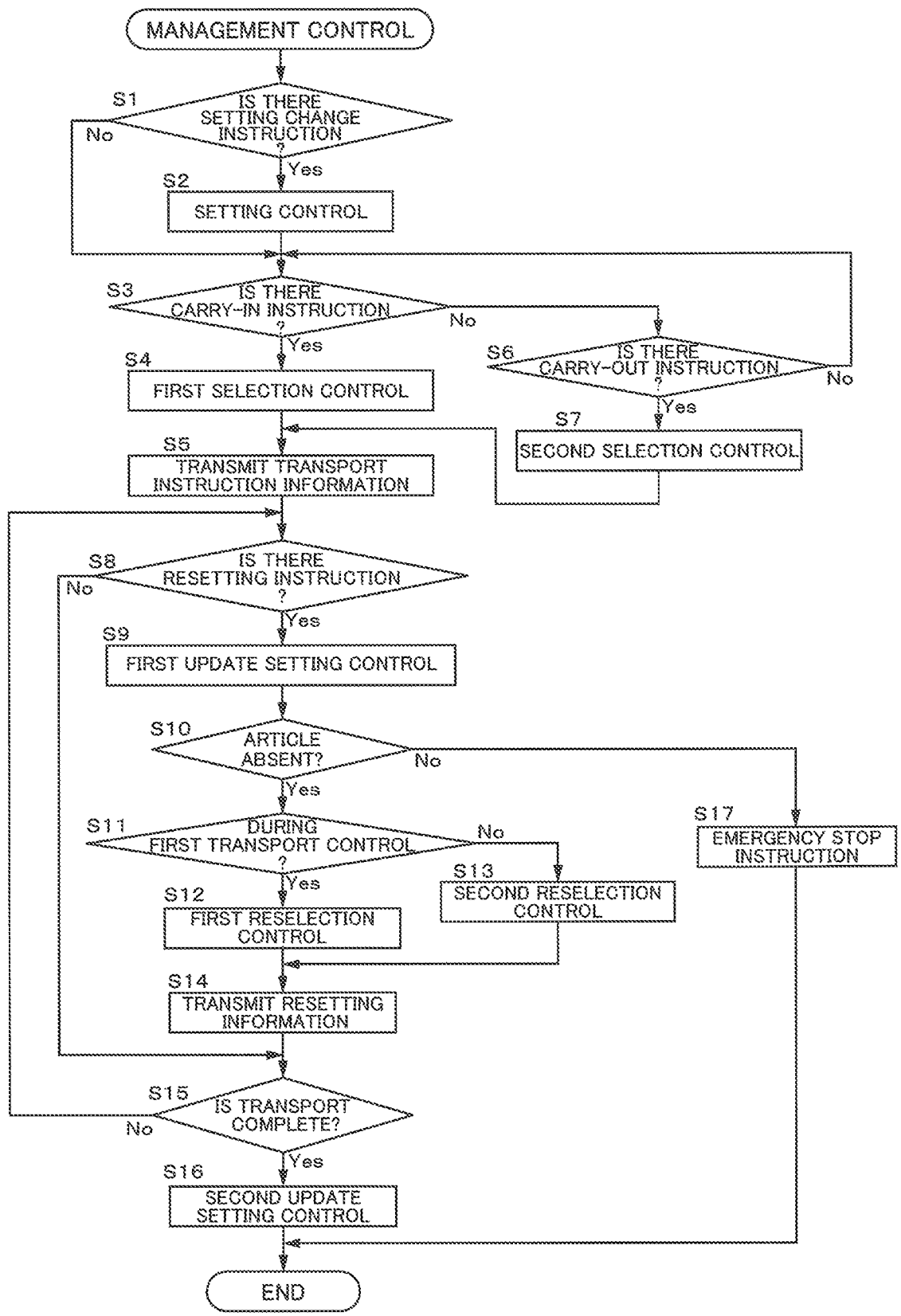
FIG. 7 is a flowchart of management control.

As shown in the flowchart of the management control shown in FIG. 7, in the management control, when a setting change instruction is input from the input unit 47 (step S1: Yes), the first controller H1 executes the setting control (step S2) to change settings of managed states of the accommodation portions 1A based on the setting change instruction. Then, the first controller H1 waits until a carry-in instruction or a carry-out instruction is received from a superordinate controller (not shown) (step S3: No, step S6: No). Upon receiving a carry-in instruction (step S3: Yes), the first controller H1 executes the first selection control (step S4) to select the inside position 4B as the transport source and select an accommodation portion 1A as the transport destination, and then transmits transport instruction information that includes information indicating the transport source and the transport destination to the second controller H2 (step S5). On the other hand, upon receiving a carry-out instruction (step S6: Yes), the first controller H1 executes the second selection control (step S7) to select an accommodation portion 1A as the transport source and select the inside position 4B as the transport destination, and then transmits transport instruction information that includes information indicating the transport source and the transport destination to the second controller H2 (step S5). The second controller H2, which has received such transport instruction information, executes the transport control.

Figure 8:
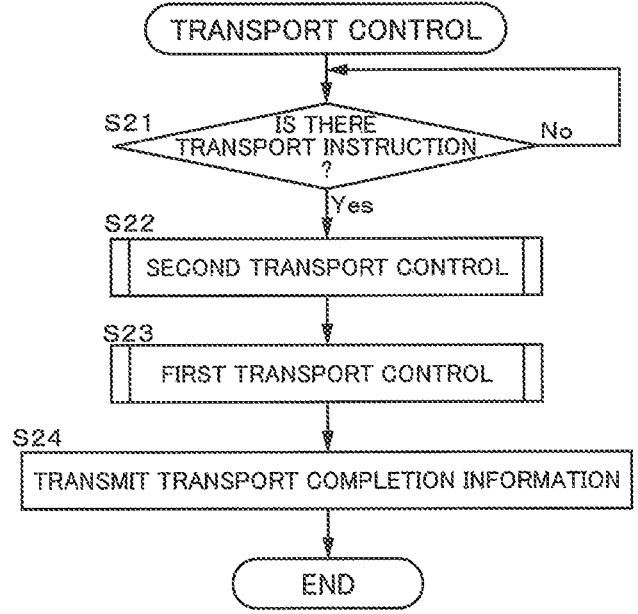
FIG. 8 is a flowchart of transport control.

That is, as shown in the flowchart of the transport control shown in FIG. 8, in the transport control, upon receiving the transport instruction information from the first controller H1 (step S21), the second controller H2 executes the second transport control (step S22) to pick up an article W from the transport source, then executes the first transport control (step S23) to put down the article W onto the transport destination, and after the transport of the article W from the transport source to the transport destination is complete, transmits transport completion information indicating that the transport is complete to the first controller H1 (step S24).

As shown in FIG. 7, in the management control, upon receiving the transport completion information from the second controller H2 (step S15: Yes) after transmitting the transport instruction information to the second controller H2 (step S5), the first controller H1 executes the second update setting control (step S16) to set the selected accommodation portion 55 as an occupied accommodation portion 54 if the selected accommodation portion 55 is the transport destination or set the selected accommodation portion 55 as an empty accommodation portion 53 if the selected accommodation portion 55 is the transport source.

Figure 9:
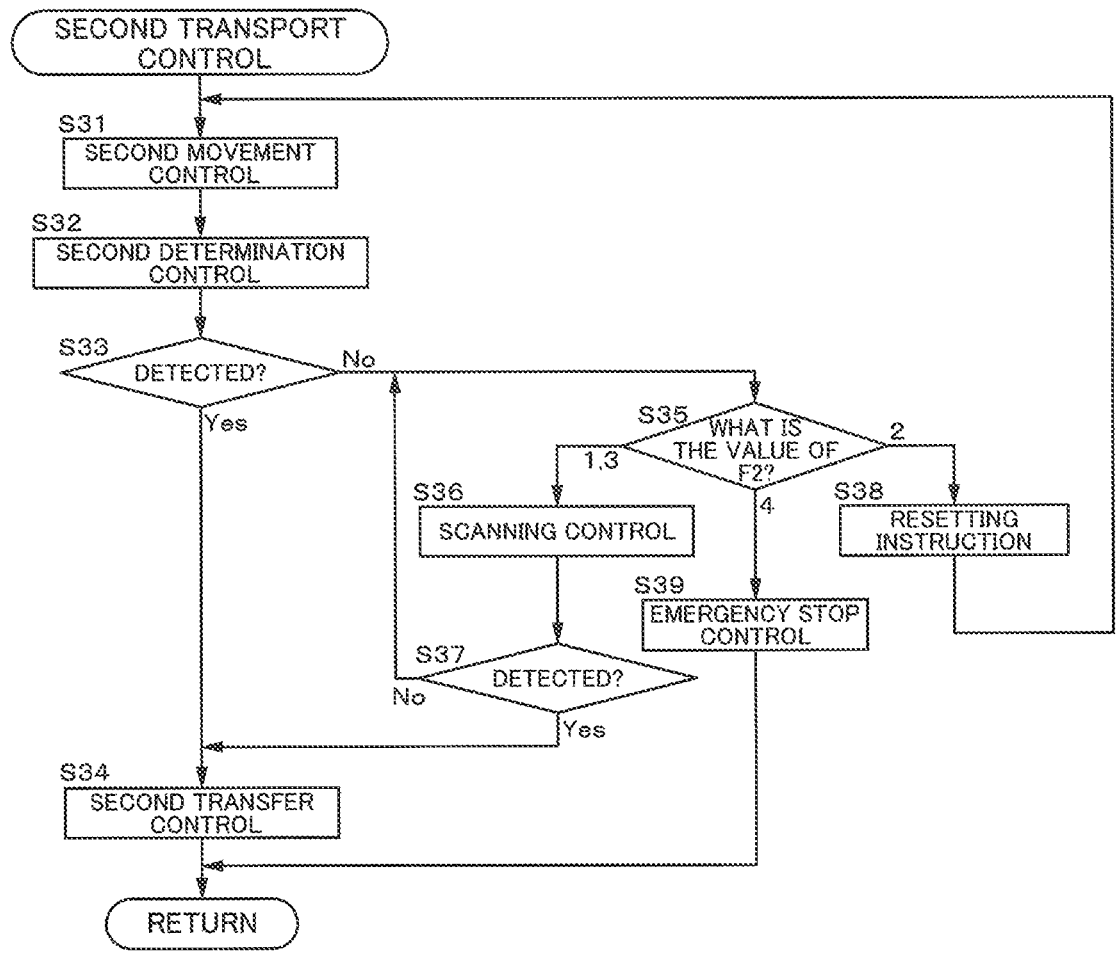
FIG. 9 is a flowchart of second transport control.

As shown in the flowchart of the second transport control shown in FIG. 9, in the second transport control, the second controller H2 executes the second movement control (step S31) to locate the transport support portion 37 at the second corresponding position P2 corresponding to the transport source, and then executes the second determination control (step S32) to determine whether or not the detection target portion 23 is detected by the second detector 35B. If the detection target portion 23 is detected in the second determination control (step S33: Yes), the second controller H2 executes the second transfer control (step S34) to pick up the article W from the transport source by using the transport support portion 37, and then ends the second transport control.

When starting execution of the second transport control, the second controller H2 sets the value of a second flag F2 to "0". The value of the second flag F2 indicates the number of times the detection target portion 23 has not been detected in the second transport control, and is increased by one every time the detection target portion 23 is not detected in the second transport control. If the detection target portion 23 is not detected in the second determination control (step S33: No), the second controller H2 sets the value of the second flag F2 to "1" and executes the scanning control (step S36) to move the detecting portion 35. If the detection target portion 23 is detected in the scanning control (step S37: Yes), the second controller H2 executes the second transfer control (step S34). On the other hand, if the detection target portion 23 is not detected in the scanning control as well (step S37: No), the second controller H2 sets the value of the second flag F2 to "2" and transmits a resetting instruction to request resetting of the transport source to the first controller H1.

As shown in FIG. 7, in the management control, upon receiving the resetting instruction from the second controller H2 (step S8: Yes) after transmitting the transport instruction information to the second controller H2 (step S5), the first controller H1 executes the first update setting control (step S9) to set the selected accommodation portion 55 and related accommodation portions 56 as prohibited accommodation portions 52. If articles W are not accommodated in the accommodation portions 1A that are set as the prohibited accommodation portions 52 (step S10: Yes) and the resetting instruction has been transmitted during execution of the second transport control (step S11: No), the first controller H1 executes the second reselection control (step S13) and transmits resetting information that indicates an accommodation portion 1A selected in the second reselection control to the second controller H2 (step S14). In the second reselection control, an accommodation portion 1A that is set as an allowed accommodation portion 51 and as an occupied accommodation portion 54 and is different from the accommodation portion 1A selected as the transport source in the first selection control or the second selection control is newly selected as the transport source. As described above, selection control is executed again (i.e., the second reselection control is executed after the second selection control) to select, as a new selected accommodation portion 55, one accommodation portion 1A that is set as an allowed accommodation portion 51 from among the plurality of accommodation portions 1A. Note that if the inside position 4B is set as the transport source in a case in which the second reselection control is executed, it is determined that the detection target portion 23 cannot be detected as a result of an error occurring in stopping the stacker crane 2, and an emergency stop instruction to cause an emergency stop of the stacker crane 2 is transmitted to the second controller H2. Also, if an article W is accommodated in an accommodation portion 1A that is set as a prohibited accommodation portion 52 (step S10: No), the first controller H1 determines that the article W cannot be taken out from the accommodation portion 1A and transmits an emergency stop instruction to cause an emergency stop of the stacker crane 2 to the second controller 112 (step S17). Upon receiving the emergency stop instruction from the first controller 111, the second controller 112 causes the stacker crane 2 to make an emergency stop. Thus, if an article W has already been accommodated in a related accommodation portion 56 when update setting control is executed, the control unit H executes emergency stop control to stop the operation of the stacker crane 2.

As shown in FIG. 9, in the second transport control, the second controller 112 executes the second movement control (step S31) and the second determination control (step S32) based on the resetting information that has been transmitted from the first controller H1 in response to the resetting instruction (step S38). Thus, the second controller 112 executes the second movement control to move the transport support portion 37 to a corresponding position that corresponds to the selected accommodation portion 55 that has been newly selected. If the detection target portion 23 is detected (step S33: Yes) in the second determination control that is executed immediately after the second movement control, the second controller 112 executes the second transfer control (step S34), and if the detection target portion 23 is not detected (step S33: No), sets the value of the second flag F2 to "3" and executes the scanning control (step S36) to move the detecting portion 35. If the detection target portion 23 is detected in the scanning control (step S37: Yes), the second controller 112 executes the second transfer control (step S34). On the other hand, if the detection target portion 23 is not detected in the scanning control as well (step S37: No), the second controller 112 sets the value of the second flag F2 to "4", and executes the emergency stop control (step S39) to cause an emergency stop of the stacker crane 2, determining that the transport support portion 37 cannot be appropriately located at a position corresponding to the second corresponding position P2 due to shifting of a reference position that is used in travelling or lifting/lowering of the stacker crane 2 or determining that many accommodation support members 21 are deformed.

Figure 10:
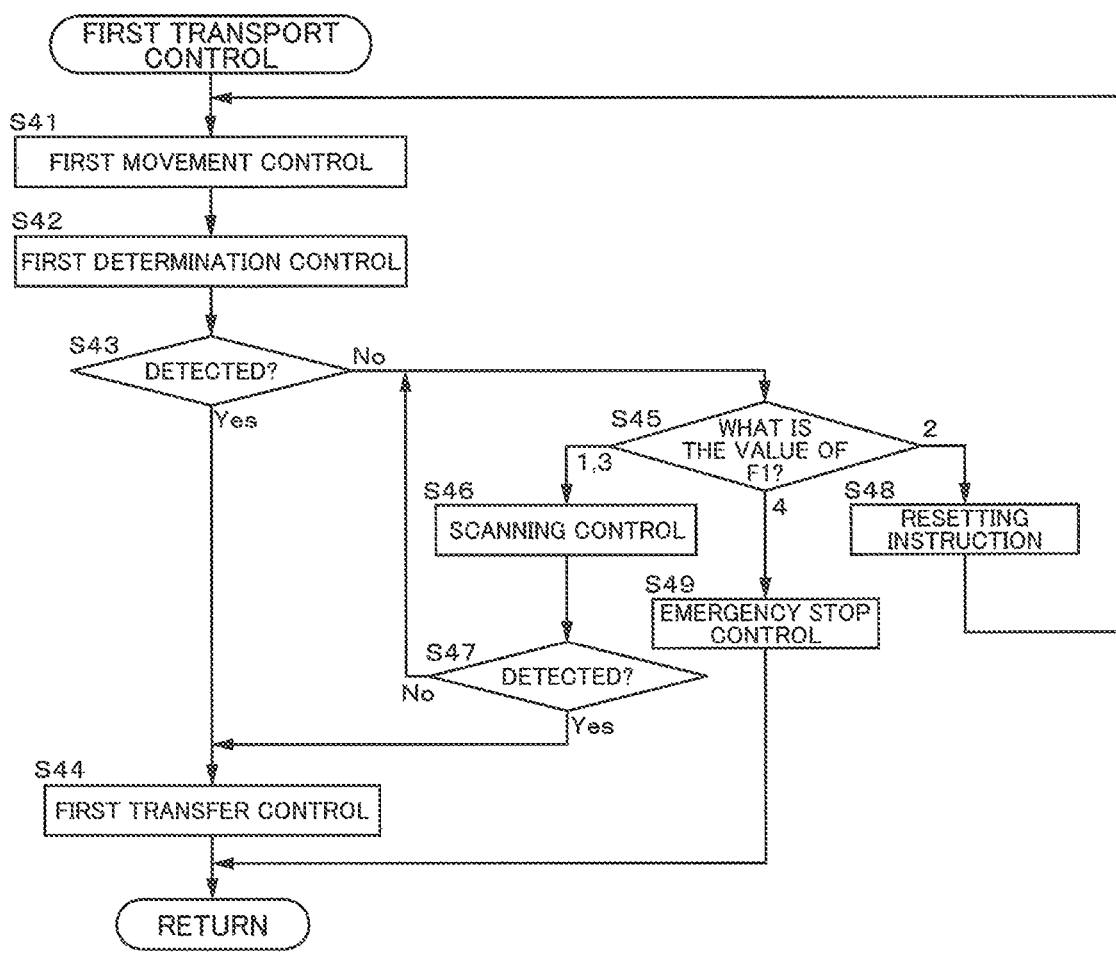
FIG. 10 is a flowchart of first transport control.

As shown in the flowchart of the first transport control shown in FIG. 10, in the first transport control, the second controller H2 executes the first movement control (step S41) to locate the transport support portion 37 at the first corresponding position P1 corresponding to the transport destination, and then executes the first determination control (step S42) to determine whether or not the detection target portion 23 is detected by the first detector 35A. If the detection target portion 23 is detected in the first determination control (step S43: Yes), the second controller H2 executes the first transfer control (step S44) to put down the article W from the transport support portion 37 onto the transport destination, and ends the first transport control.

When starting execution of the first transport control, the second controller H2 sets the value of a first flag F1 to "0". The value of the first flag F1 indicates the number of times the detection target portion 23 has not been detected in the first transport control, and is increased by one every time the detection target portion 23 is not detected in the first transport control. If the detection target portion 23 is not detected in the first determination control (step S43: No), the second controller H2 sets the value of the first flag F1 to "1" and executes the scanning control (step S46) to move the detecting portion 35. If the detection target portion 23 is detected in the scanning control (step S47: Yes), the second controller H2 executes the first transfer control (step S44). On the other hand, if the detection target portion 23 is not detected in the scanning control as well (step S47: No), the second controller H2 sets the value of the first flag F1 to "2" and transmits a resetting instruction to request resetting of the transport destination to the first controller H1.

As shown in FIG. 7, in the management control, upon receiving the resetting instruction from the second controller H2 (step S8: Yes) after transmitting the transport instruction information to the second controller H2 (step S5), the first controller H1 executes the first update setting control (step S9) to set the selected accommodation portion 55 and related accommodation portions 56 as prohibited accommodation portions 52. If articles W are not accommodated in the accommodation portions 1A that are set as the prohibited accommodation portions 52 (step S10: Yes) and the resetting instruction has been transmitted during execution of the first transport control (step S11: Yes), the first controller H1 executes the first reselection control (step S12) and transmits resetting information that indicates an accommodation portion 1A selected in the first reselection control to the second controller H2 (step S14). In the first reselection control, an accommodation portion 1A that is set as an allowed accommodation portion 51 and as an empty accommodation portion 53 and is different from the accommodation portion 1A selected as the transport destination in the first selection control or the second selection control is newly selected as the transport destination. As described above, selection control is executed again (i.e., the first reselection control is executed after the first selection control) to select, as a new selected accommodation portion 55, one accommodation portion 1A that is set as an allowed accommodation portion 51 from among the plurality of accommodation portions 1A. Note that if the inside position 4B is set as the transport destination in a case in which the first reselection control is executed, it is determined that the detection target portion 23 cannot be detected as a result of an error occurring in stopping the stacker crane 2, and an emergency stop instruction to cause an emergency stop of the stacker crane 2 is transmitted to the second controller H2.

As shown in FIG. 10, in the first transport control, the second controller H2 executes the first movement control (step S41) and the first determination control (step S42) based on the resetting information that has been transmitted from the first controller H1 in response to the resetting instruction (step S48). Thus, the second controller H2 executes the first movement control to move the transport support portion 37 to a corresponding position that corresponds to the selected accommodation portion 55 that has been newly selected. If the detection target portion 23 is detected (step S43: Yes) in the first determination control that is executed immediately after the first movement control, the second controller H2 executes the first transfer control (step S44), and if the detection target portion 23 is not detected (step S43: No), sets the value of the first flag F1 to "3" and executes the scanning control (step S46) to move the detecting portion 35. If the detection target portion 23 is detected in the scanning control (step S47: Yes), the second controller H2 executes the first transfer control (step S44). On the other hand, if the detection target portion 23 is not detected in the scanning control as well (step S47: No), the second controller H2 sets the value of the first flag F1 to "4", and executes the emergency stop control (step S49) to cause an emergency stop of the stacker crane 2, determining that the transport support portion 37 cannot be appropriately located at a position corresponding to the first corresponding position P1 due to shifting of a reference position that is used in travelling or lifting/lowering of the stacker crane 2 or determining that many accommodation support members 21 are deformed.

In the first transport control and the second transport control, if the detection target portion 23 is not detected by the detecting portion 35 in a state in which the transport support portion 37 is located at the corresponding position, the second controller 112 executes the scanning control to move the position of the detecting portion 35 in the prescribed range, and if the detection target portion 23 is not detected by the detecting portion 35 even if the scanning control is executed, the second controller 112 determines that the detection target portion 23 is not detected. That is, in the present embodiment, determination control performed in the first transport control includes the first determination control and the scanning control, and determination control performed in the second transport control includes the second determination control and the scanning control.

2. Other Embodiments

Next, other embodiments of the article transport facility will be described.

(1) In the above-described embodiment, a configuration is described as an example in which, if it is determined that the detection target portion 23 is not detected in determination control that is performed subsequently to selection control and movement control that are executed immediately after update setting control, the control unit H executes the emergency stop control to stop the operation of the stacker crane 2. However, there is no limitation to such a configuration. For example, a configuration is also possible in which, if it is determined that the detection target portion 23 is not detected in determination control performed subsequently to selection control and movement control executed immediately after update setting control, the control unit H further executes update setting control and thereafter executes selection control and movement control.

(2) In the above-described embodiment, a configuration is described as an example in which, in the determination control, it is determined that the detection target portion 23 is not detected if the detection target portion 23 is not detected by the detecting portion 35 even if the scanning control is executed. However, there is no limitation to such a configuration. For example, a configuration is also possible in which, in the determination control, the scanning control is not executed and it is determined that the detection target portion 23 is not detected if the detection target portion 23 is not detected by the detecting portion 35 in a state in which the transport support portion 37 is located at a corresponding position.

(3) In the above-described embodiment, an example is described in which the accommodation support member 21 is configured to support the bottom surface 16 of an article W from below. However, there is no limitation to such a configuration. The configuration for supporting the article W by the accommodation support member 21 may also be appropriately changed to, for example, a configuration in which the accommodation support member 21 supports an upper end portion of the article W.

(4) In the above-described embodiment, a configuration is described as an example in which accommodation portions 1A that are adjacent to the selected accommodation portion 55 on the lower side Z2, the right side Y1, and the left side Y2 of the selected accommodation portion 55 are set as the related accommodation portions 56. However, there is no limitation to such a configuration. For example, any one or more accommodation portions 1A selected from accommodation portions 1A that are adjacent to the selected accommodation portion 55 in four directions, i.e., on the upper side Z1, the lower side Z2, the right side Y1, and the left side Y2 of the selected accommodation portion 55 can be set as related accommodation portions 56. Furthermore, it is also possible to set, as related accommodation portions 56, any one or more accommodation portions 1A selected from two accommodation portions 1A that are adjacent to the selected accommodation portion 55 on diagonally upper sides of the selected accommodation portion 55 and two accommodation portions 1A that are adjacent to the selected accommodation portion 55 on diagonally lower sides of the selected accommodation portion 55. Thus, accommodation portions 1A selected as related accommodation portions 56 can be appropriately set.

(5) In the above-described embodiment, a configuration is described as an example in which the stacker crane 2 serves as the transport apparatus. However, there is no limitation to such a configuration. For example, the transport apparatus may also be configured by arranging, in the vertical direction Z, a plurality of transport carriages that travel in the left-right direction Y. Alternatively, the transport apparatus may also be configured so as to include the lifting/lowering member 33 that moves up and down along a rail. In such a case, a configuration is also preferable in which a plurality of accommodation portions 1A are arcuately arranged when viewed in the vertical direction Z, and articles W can be accommodated in the plurality of accommodation portions 1A arcuately arranged in the left-right direction Y as a result of the transfer apparatus 34 turning relative to the lifting/lowering member 33.

(6) Note that configurations disclosed in the above-described embodiments can also be applied in combination with configurations disclosed in other embodiments so long as no contradiction is incurred. Regarding other configurations, the embodiments disclosed in the present description are merely examples in all aspects. Therefore, various alterations can be appropriately made within a scope not departing from the gist of the present disclosure.

3. Summary of the Above-Described Embodiment

The following describes a summary of the article transport facility described above.

An article transport facility includes an article accommodation rack that includes a plurality of accommodation portions arranged in a vertical direction and a left-right direction, a transport apparatus that transports articles to the accommodation portions, and a control unit that controls the transport apparatus, wherein each of the plurality of accommodation portions includes an accommodation support member that supports an article accommodated in the accommodation portion, the transport apparatus includes a transport support portion that supports an article, a transfer portion that transfers an article from the transport support portion to the accommodation portion in a state in which the transport support portion is located at a corresponding position that corresponds to the accommodation portion, and a detecting portion that detects a detection target portion included in the accommodation support member in a state in which the transport support portion is located at the corresponding position, the control unit executes setting control to set, with respect to each of the plurality of accommodation portions, whether the accommodation portion is an allowed accommodation portion or a prohibited accommodation portion, accommodating an article in the allowed accommodation portion being allowed, accommodating an article in the prohibited accommodation portion being prohibited, selection control to select, as a selected accommodation portion, one accommodation portion that is set as the allowed accommodation portion from among the plurality of accommodation portions, movement control to control the transport apparatus so as to move the transport support portion to the corresponding position corresponding to the selected accommodation portion, determination control to determine whether or not the detection target portion is detected by the detecting portion after the movement control, transfer control to control the transport apparatus so as to transfer an article from the transport support portion to the accommodation support member included in the selected accommodation portion if it is determined, in the determination control, that the detection target portion is detected, and update setting control to set the selected accommodation portion and one or more related accommodation portions each as the prohibited accommodation portion if it is determined, in the determination control, that the detection target portion is not detected, the related accommodation portions being accommodation portions each having a positional relationship set in advance with respect to the selected accommodation portion, and after the update setting control, the control unit again executes the selection control to newly select, as the selected accommodation portion, one accommodation portion that is set as the allowed accommodation portion from among the plurality of accommodation portions, and executes the movement control to move the transport support portion to the corresponding position corresponding to the selected accommodation portion that has been newly selected.

According to this configuration, the control unit selects an accommodation portion as the selected accommodation portion by the selection control, and moves the transport support portion to the corresponding position corresponding to the selected accommodation portion by the movement control. In such a state in which the transport support portion has been moved to the corresponding position corresponding to the selected accommodation portion, if it is determined that the detection target portion is not detected by the detecting portion, the control unit executes the update setting control to set the selected accommodation portion and the related accommodation portions as prohibited accommodation portions.

As a cause of the detection target portion not being detected by the detecting portion in a state in which the transport support portion is located at the corresponding position corresponding to the selected accommodation portion, it is possible to consider deformation of the accommodation support member of the selected accommodation portion and consequent shifting of the position of the detection target portion provided in the accommodation support member. If the accommodation support member is deformed, when an article is accommodated in the accommodation portion including the accommodation support member, problems may occur such as a case in which the article comes into contact with the accommodation support member and is damaged and a case in which the article falls off from the accommodation support member. Also, when an article is accommodated in another accommodation portion that is located around the accommodation portion including the deformed accommodation support member, problems may occur such as a case in which the article comes into contact with the deformed accommodation support member and is damaged and a case in which the article falls off. However, according to this configuration, in such cases, the selected accommodation portion and the related accommodation portions are set as the prohibited accommodation portions in the update setting control and will not be selected as the selected accommodation portion in the following selection control, and therefore it is possible to avoid problems that would occur when articles are accommodated in these accommodation portions. Furthermore, after the update setting control is executed as described above, the selection control and the movement control are executed with respect to updated allowed accommodation portions, and therefore articles can be continuously transported. Thus, it is possible to continuously transport articles while avoiding the occurrence of problems when accommodating the articles.

Here, a configuration is preferable in which the accommodation support member is configured to support a bottom surface of an article from below, and the related accommodation portions are accommodation portions that are adjacent to the selected accommodation portion on a lower side, a right side, and a left side of the selected accommodation portion for which it is determined, in the determination control, that the detection target portion is not detected.

According to this configuration, the accommodation support member is located below the article accommodated in the accommodation portion. Accordingly, if the accommodation support member of the selected accommodation portion is deformed toward the lower side, an article may come into contact with the deformed accommodation support member when the article is accommodated in an accommodation portion that is adjacent to the selected accommodation portion on the lower side of the selected accommodation portion. Also, if the accommodation support member of the selected accommodation portion is deformed toward the right side or the left side, an article may come into contact with the deformed accommodation support member when the article is accommodated in an accommodation portion that is adjacent to the selected accommodation portion on the right side or the left side of the selected accommodation portion. In contrast, even if the accommodation support member of the selected accommodation portion is deformed toward the upper side, there is almost no possibility that an article comes into contact with the deformed accommodation support member when the article is accommodated in an accommodation portion that is adjacent to the accommodation portion including the accommodation support member on the upper side thereof.

According to this configuration, accommodation portions that are adjacent to the selected accommodation portion on the lower side, the right side, and the left side of the selected accommodation portion are set as related accommodation portions and are set as prohibited accommodation portions in the update setting control, and therefore it is possible to avoid problems that would occur when articles are accommodated in these accommodation portions. On the other hand, an accommodation portion that is adjacent to the selected accommodation portion on the upper side of the selected accommodation portion is not set as a related accommodation portion and is not set as a prohibited accommodation portion in the update setting control to maintain a state in which an article can be accommodated in the adjacent accommodation portion located on the upper side. Therefore, a reduction in the accommodation efficiency of the article accommodation rack can be suppressed when compared to a case in which the adjacent accommodation portion located on the upper side is set as the related accommodation portion.

Also, a configuration is preferable in which, if an article has already been accommodated in any of the related accommodation portions when the update setting control is executed, the control unit executes emergency stop control to stop the operation of the transport apparatus.

According to this configuration, it is possible to avoid a situation in which a required article cannot be taken out from the article accommodation rack because the article cannot be taken out from the related accommodation portion.

Also, a configuration is preferable in which, in the determination control that is performed subsequently to the selection control and the movement control executed immediately after the update setting control, if it is determined that the detection target portion is not detected, the control unit executes emergency stop control to stop the operation of the transport apparatus.

As a cause of the detection target portion not being detected by the detecting portion in a state in which the transport support portion is located at the corresponding position corresponding to the selected accommodation portion, other than the above-described deformation of the accommodation support member, it is possible to consider the shifting of a stop position of the transport support portion from the corresponding position as a result of the occurrence of an error in the stop position of the transport support portion in the movement control. In such a case, it is highly likely that the detection target portion will not be detected by the detecting portion even if another accommodation portion is selected as the selected accommodation portion and the transport support portion is moved to a corresponding position of the selected accommodation portion. In such a case, according to this embodiment, the emergency stop control is executed to stop the operation of the transport apparatus, and therefore, even if an error has occurred in the stop position of the transport support portion, it is possible to immediately deal with the situation.

Also, a configuration is preferable in which, in the determination control, if the detection target portion is not detected by the detecting portion in a state in which the transport support portion is located at the corresponding position, scanning control is executed to move the position of the detecting portion in a prescribed range, and if the detection target portion is not detected by the detecting portion even if the scanning control is executed, it is determined that the detection target portion is not detected.

Even if the detection target portion is not detected by the detecting portion in a state in which the transport support portion is located at the corresponding position, there are cases in which deformation of the accommodation support member or shifting of the stop position of the transport support portion is insignificant and hardly affects accommodation of the article. According to this configuration, even if the detection target portion is not detected by the detecting portion in a state in which the transport support portion is located at the corresponding position, if the detection target portion is detected by the detecting portion as a result of the scanning control being executed by the control unit, it is possible to determine that deformation of the transport support portion or shifting of the stop position of the transport support portion is insignificant and will not affect accommodation of the article, and execute the transfer control. Furthermore, if the detection target portion is not detected by the detecting portion as a result of the scanning control being executed by the control unit, it is determined that deformation of the transport support portion or shifting of the stop position of the transport support portion is significant and will affect accommodation of the article, and the article is not accommodated in the selected accommodation portion, and therefore it is possible to avoid problems that would occur when the article is accommodated.

The technology according to the present disclosure is applicable to an article transport facility that includes a transport apparatus that transports articles to accommodation portions and a control unit that controls the transport apparatus.

What is claimed is:

1. An article transport facility comprising:
   an article accommodation rack that includes a plurality of accommodation portions arranged in a vertical direction and a left-right direction;
   a transport apparatus that transports articles to the accommodation portions; and
   a control unit that controls the transport apparatus,
   wherein:
   each of the plurality of accommodation portions includes an accommodation support member that supports an article accommodated in the accommodation portion,
   the transport apparatus includes a transport support portion that supports an article, a transfer portion that transfers an article from the transport support portion to the accommodation portion in a state in which the transport support portion is located at a corresponding position that corresponds to the accommodation portion, and a detecting portion that detects a detection target portion included in the accommodation support member in a state in which the transport support portion is located at the corresponding position, and
   the control unit executes:
      setting control to set, with respect to each of the plurality of accommodation portions, whether the accommodation portion is an allowed accommodation portion or a prohibited accommodation portion, accommodating an article in the allowed accommodation portion being allowed, accommodating an article in the prohibited accommodation portion being prohibited,
      selection control to select, as a selected accommodation portion, one accommodation portion that is set as the allowed accommodation portion from among the plurality of accommodation portions,
      movement control to control the transport apparatus so as to move the transport support portion to the corresponding position corresponding to the selected accommodation portion,
      determination control to determine whether or not the detection target portion is detected by the detecting portion after the movement control,
      transfer control to control the transport apparatus so as to transfer an article from the transport support portion to the accommodation support member included in the selected accommodation portion if it is determined, in the determination control, that the detection target portion is detected, and update setting control to set the selected accommodation portion and one or more related accommodation portions each as the prohibited accommodation portion if it is determined, in the determination control, that the detection target portion is not detected, the related accommodation portions being accommodation portions each having a positional relationship set in advance with respect to the selected accommodation portion, and wherein after the update setting control, the control unit again executes the selection control to newly select, as the selected accommodation portion, one accommodation portion that is set as the allowed accommodation portion from among the plurality of accommodation portions, and executes the movement control to move the transport support portion to the corresponding position corresponding to the selected accommodation portion that has been newly selected.

2. The article transport facility according to claim 1, wherein the accommodation support member is configured to support a bottom surface of an article from below, and wherein the related accommodation portions are accommodation portions that are adjacent to the selected accommodation portion on a lower side, a right side, and a left side of the selected accommodation portion for which it is determined, in the determination control, that the detection target portion is not detected.

3. The article transport facility according to claim 1, wherein if an article has already been accommodated in any of the related accommodation portions when the update setting control is executed, the control unit executes emergency stop control to stop the operation of the transport apparatus.

4. The article transport facility according to claim 1, wherein, in the determination control that is performed subsequently to the selection control and the movement control that are executed immediately after the update setting control, if it is determined that the detection target portion is not detected, the control unit executes emergency stop control to stop the operation of the transport apparatus.

5. The article transport facility according to claim 1, wherein, in the determination control, if the detection target portion is not detected by the detecting portion in a state in which the transport support portion is located at the corresponding position, scanning control is executed to move the position of the detecting portion in a prescribed range, and if the detection target portion is not detected by the detecting portion even if the scanning control is executed, it is determined that the detection target portion is not detected.

\* \* \* \* \*